US011621366B2

(12) United States Patent
Cabal et al.

(10) Patent No.: US 11,621,366 B2
(45) Date of Patent: Apr. 4, 2023

(54) PASSIVATION PROCESS

(71) Applicant: Commissariat a l'energie atomique et aux energies alternatives, Paris (FR)

(72) Inventors: Raphael Cabal, Grenoble (FR); Bernadette Grange, Grenoble (FR)

(73) Assignee: Commissariat a l'energie atomique et aux energies alternatives, Paris (FR)

( * ) Notice: Subject to any disclaimer, the term of this patent is extended or adjusted under 35 U.S.C. 154(b) by 19 days.

(21) Appl. No.: 16/916,417

(22) Filed: Jun. 30, 2020

(65) Prior Publication Data
US 2021/0005774 A1 Jan. 7, 2021

(30) Foreign Application Priority Data

Jul. 1, 2019 (FR) ...................................... 19 07245

(51) Int. Cl.
*H01L 31/18* (2006.01)
*H01L 31/0224* (2006.01)
(52) U.S. Cl.
CPC ............ *H01L 31/1868* (2013.01); *H01L 31/022475* (2013.01); *H01L 31/022483* (2013.01)
(58) Field of Classification Search
CPC ......... H01L 31/1868; H01L 31/022475; H01L 31/022483; H01L 31/02167; H01L 31/02168; H01L 31/022441; H01L 31/068; H01L 21/3003; H01L 21/208; Y02E 10/547; Y02P 70/50
See application file for complete search history.

(56) References Cited

U.S. PATENT DOCUMENTS

| | | | | |
|---|---|---|---|---|
| 4,872,043 A | * | 10/1989 | Fujii | ................... H01L 29/1062 257/253 |
| 6,734,037 B1 | | 5/2004 | Fath et al. | |
| 8,932,495 B1 | * | 1/2015 | Nguyen | ................... H01B 1/08 252/520.5 |
| 2009/0101202 A1 | | 4/2009 | Sun et al. | |
| 2013/0171836 A1 | * | 7/2013 | Liu | ....................... H01L 21/443 438/768 |

(Continued)

FOREIGN PATENT DOCUMENTS

| | | |
|---|---|---|
| CN | 102593253 A | 7/2012 |
| EP | 2 051 307 A2 | 4/2009 |
| KR | 10-2011-0075992 A | 7/2011 |

OTHER PUBLICATIONS

French Preliminary Search Report dated Nov. 14, 2019 in Patent Application No. FR 1907245 (with English translation of categories of cited documents), 11 pages.

(Continued)

*Primary Examiner* — Bitew A Dinke
(74) *Attorney, Agent, or Firm* — Oblon, McClelland, Maier & Neustadt, L.L.P.

(57) ABSTRACT

A passivation process includes the successive steps of a) providing a stack having, in succession, a substrate based on crystalline silicon, a layer of silicon oxide, and at least one layer of transparent conductive oxide; and b) applying a hydrogen-containing plasma to the stack, step b) being executed at a suitable temperature so that hydrogen atoms of the hydrogen-containing plasma diffuse to the interface between the substrate and the layer of silicon oxide.

25 Claims, 1 Drawing Sheet

(56) References Cited

U.S. PATENT DOCUMENTS

| | | | | |
|---|---|---|---|---|
| 2014/0159042 A1* | 6/2014 | Hutchings | ......... | H01L 21/02669 438/483 |
| 2014/0227825 A1* | 8/2014 | Chen | ..................... | H01L 31/077 438/87 |
| 2014/0360571 A1* | 12/2014 | Ji | ........................ | H01L 31/0745 136/258 |
| 2015/0021599 A1* | 1/2015 | Ridgeway | ............. | C23C 16/345 257/43 |
| 2015/0140726 A1* | 5/2015 | Honda | ................ | H01L 31/1884 438/98 |
| 2015/0357510 A1* | 12/2015 | Lee | ..................... | H01L 31/1868 438/98 |
| 2017/0104113 A1* | 4/2017 | Haight | ................ | H01L 31/1896 |
| 2018/0138354 A1* | 5/2018 | Jaffrennou | .......... | H01L 31/1864 |
| 2019/0386158 A1* | 12/2019 | Qiu | ..................... | H01L 31/0745 |
| 2020/0194259 A1* | 6/2020 | Raynal | ............. | H01L 21/02598 |
| 2021/0043784 A1* | 2/2021 | Kessels | ............... | H01L 31/1868 |

OTHER PUBLICATIONS

Alan E. Delahay, et al., "Transparent Conducting Oxides for Photovoltaics" Handbook of Photovoltaic Science and Engineering, Second Edition, XP055113336, Dec. 21, 2010, pp. 716-796.

M. Spiegel, et al., "Detailed Study on Microwave Induced Remote Hydrogen Plasma Passivation of Multicrystalline Silicon" Proceedings of the European Photovoltaic Solar Energy Conference, vol. I, XP002160391, Oct. 23, 1995, pp. 421-424.

M. Spiegel, et al., "Ribbon Growth on Substrate (RGS) Silicon Solar Cells with Microwave-Induced Remote Hydrogen Plasma Passivation and Efficiencies Exceeding 11%" Solar Energy Materials and Solar Cells, Elsevier Science Publishers, Amsterdam, vol. 55, No. 4, XP004153254, Sep. 4, 1998, pp. 331-340.

* cited by examiner

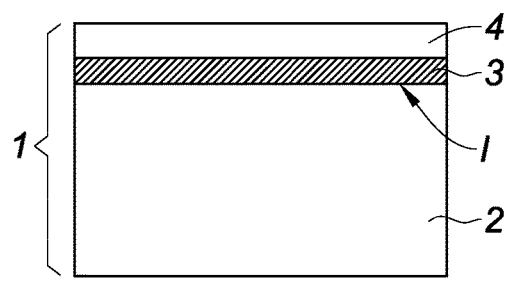
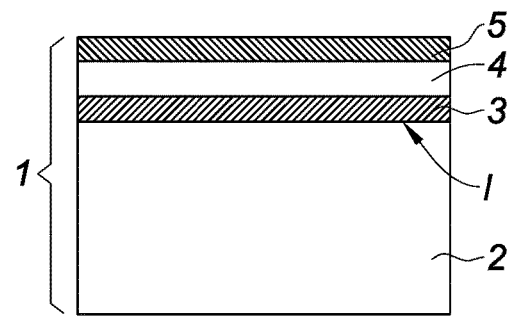
Fig. 1        Fig. 2
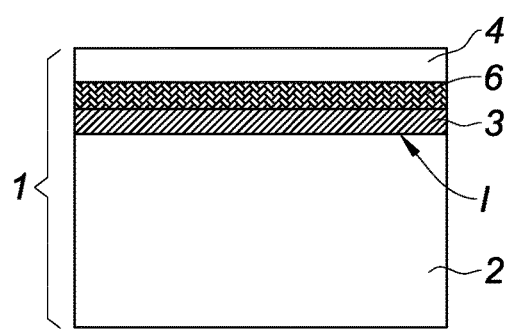
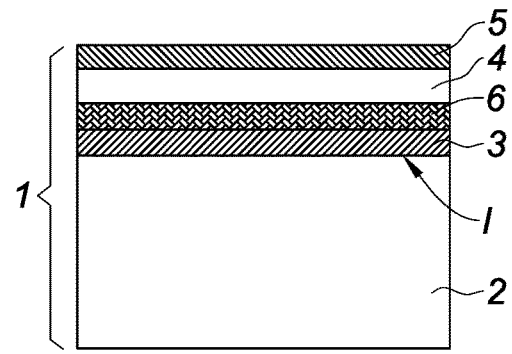
Fig. 3        Fig. 4

PASSIVATION PROCESS

TECHNICAL FIELD

The invention relates to the technical field of passivation of a surface of a substrate based on crystalline silicon.

The invention is notably applicable to the fabrication of homojunction photovoltaic cells comprising at least one layer of transparent conductive oxide.

PRIOR ART

One photovoltaic cell known in the prior art comprises a stack comprising, in succession:

a substrate based on crystalline silicon, coated with a layer of amorphous silicon, at least one layer of transparent conductive oxide, and a metal electrode forming an electrical contact.

The one or more layers of transparent conductive oxide notably allow electrical contact to be ensured between the metal electrode and the substrate. The one or more layers of transparent conductive oxide may also play the role of an antireflection layer, these layers having a thickness suitable for this purpose. The antireflection layer allows optical losses associated with reflections of light to be decreased, and therefore the absorption of light by the substrate to be optimized.

However, the one or more layers of transparent conductive oxide are not entirely satisfactory in so far as they do not allow the surface of the substrate to be passivated, i.e. electrically active defects on the surface of the substrate (i.e. at the interface between the substrate and the layer of amorphous silicon) to be neutralized, this adversely affecting the conversion efficiency of the photovoltaic cell. The surface of the substrate is passivated by the layer of amorphous silicon, which has the drawback of being highly absorbent in the ultraviolet. A compromise must therefore be sought with respect to the thickness of the layer of amorphous silicon, to maximize the conversion efficiency.

SUMMARY OF THE INVENTION

The invention aims to remedy all or some of the aforementioned drawbacks. To this end, the subject of the invention is a passivation process comprising the successive steps of:

a) providing a stack comprising, in succession, a substrate based on crystalline silicon, a layer of silicon oxide, and at least one layer of transparent conductive oxide; and b) applying a hydrogen-containing plasma to the stack, step b) being executed at a suitable temperature so that hydrogen atoms of the hydrogen-containing plasma diffuse to the interface between the substrate and the layer of silicon oxide.

Thus, such a process according to the invention allows the surface of the substrate to be passivated, despite the presence of the one or more layers of transparent conductive oxide, by virtue of step b). Specifically, the hydrogen of the hydrogen-containing plasma diffuses in atomic form to the interface between the substrate and the layer of silicon oxide and is in particular liable to saturate dangling bonds at the surface of the substrate. Such a process according to the invention means that a layer of amorphous silicon is not required to passivate the surface of the substrate.

Definitions

By "passivation", what is meant is the neutralization of electrically active defects on the surface of the substrate. Specifically, the surface of a substrate made of crystalline silicon has a defect density (e.g. dangling bonds, impurities, discontinuities in the crystal, etc.) liable to lead to non-negligible losses as a result of surface recombination of carriers, in the case of a photovoltaic application.

By "substrate", what is meant is a self-supporting physical carrier intended for the fabrication of a photovoltaic cell. The substrate may be a wafer cut from an ingot of crystalline silicon.

By "crystalline", what is meant is the multi-crystalline form or single-crystal form of silicon, excluding therefore amorphous silicon.

By "based on", what is meant is that the crystalline silicon is the main and majority material from which the substrate is made.

By "silicon oxide", what is meant is silicon dioxide ($SiO_2$) or non-stoichiometric derivatives thereof ($SiO_x$).

By "transparent conductive oxide" or "TCO", what is meant is an oxide that is transparent in all or some of the solar spectrum, and electrically conductive. For example, the transparent conductive oxide may have a transmittance higher than or equal to 60% (preferably higher than or equal to 80%) in the spectrum [300 nm, 900 nm].

By "hydrogen-containing plasma", what is meant is a plasma in which the gaseous species comprises hydrogen atoms.

The process according to the invention may comprise one or more of the following features.

According to one feature of the invention, the hydrogen-containing plasma applied in step b) contains at least one gas selected from $NH_3$ and $H_2$.

One advantageous effect thereof is the ease with which such hydrogen-containing plasmas, in particular an $NH_3$ plasma, may be implemented.

According to one feature of the invention, the temperature at which step b) is executed is comprised between 340° C. and 600° C., preferably comprised between 400° C. and 550° C., and more preferably comprised between 400° C. and 500° C.

One advantageous effect of such temperature ranges is that they allow hydrogen atoms to diffuse (thermal activation) to the interface between the substrate and the layer of silicon oxide, while neither degrading the one or more layers of transparent conductive oxide nor the layer of silicon oxide.

According to one feature of the invention, the hydrogen-containing plasma is applied in step b) with a power density comprised between $1\times10^{-3}$ $W\cdot cm^{-2}$ and $2\times10^{-2}$ $W\cdot cm^{-2}$, and preferably comprised between $5\times10^{-3}$ $W\cdot cm^{-2}$ and $1\times10^{-2}$ $W\cdot cm^{-2}$.

By "power", what is meant is the power injected to generate and maintain the plasma.

By "density", what is meant is the power divided by the developed surface area of the electrodes used to generate the plasma.

One advantageous effect thereof is to improve the passivation of the interface between the substrate and the layer of silicon oxide.

According to one feature of the invention, the hydrogen-containing plasma is applied in step b) with a pressure comprised between 1.5 torr and 2.5 torr, and preferably comprised between 1.7 torr and 2.2 torr.

One advantageous effect thereof is to improve the passivation of the interface between the substrate and the layer of silicon oxide.

According to one feature of the invention, step b) is executed under an atmosphere containing an inert gas selected from Ar and $N_2$.

One advantageous effect thereof is to improve the stability and uniformity of the hydrogen-containing plasma.

According to one feature of the invention, step b) is executed for a time comprised between 5 minutes and 90 minutes, and preferably comprised between 10 minutes and 30 minutes.

One advantageous effect thereof is to avoid processing times that are too long and detrimental to the implementation of the process on the industrial scale.

According to one feature of the invention, the layer of silicon oxide of the stack provided in step a) has a thickness smaller than or equal to 4 nm, and preferably smaller than or equal to 2 nm.

One advantageous effect thereof is to protect the substrate without significantly affecting the electrical conductivity of the stack, with respect to movement of charge carriers.

According to one feature of the invention, the one or more layers of transparent conductive oxide have a total thickness comprised between 10 nm and 200 nm.

One advantageous effect thereof is to obtain a good compromise between electrical conductivity (with respect to the movement of charge carriers) and the time taken to deposit the one or more layers of transparent conductive oxide.

According to one feature of the invention, the transparent conductive oxide is selected from an indium oxide and a zinc oxide, the indium oxide preferably being chosen from indium-tin oxide, a fluorine-doped indium oxide, a hydrogen-containing indium oxide and a tungsten-doped indium oxide, and the zinc oxide preferably being chosen from an aluminium-doped zinc oxide and a boron-doped zinc oxide.

According to one feature of the invention, the transparent conductive oxide is selected from a zinc oxide, an aluminium-doped zinc oxide and a boron-doped zinc oxide.

A zinc oxide will be preferred in so far as indium is expensive and a limited resource, and in addition is a contaminant liable to degrade the charge-carrier lifetime within the stack.

According to one feature of the invention, step a) comprises a step $a_1$) consisting in forming a layer of alumina on the one or more layers of transparent conductive oxide.

By "alumina", what is meant is aluminium oxide of formula ($Al_2O_3$) or the non-stoichiometric derivatives thereof ($AlO_x$).

One advantageous effect thereof is to improve the passivation of the interface between the substrate and the layer of silicon oxide.

According to one feature of the invention, step $a_1$) is executed so that the layer of alumina has a thickness smaller than or equal to 20 nm, and preferably comprised between 2 nm and 10 nm.

Such thicknesses allow the passivation of the interface between the substrate and the layer of silicon oxide to be improved without significantly affecting the electrical conductivity of the stack, with respect to movement of charge carriers.

According to one feature of the invention, step $a_1$) is executed using a deposition technique chosen from ALD, physical vapour deposition and chemical vapour deposition.

According to one feature of the invention, step a) is executed so that a layer of polysilicon is inserted between the layer of silicon oxide and the one or more layers of transparent conductive oxide.

One advantageous effect thereof is to improve the passivation of the interface between the substrate and the layer of silicon oxide.

BRIEF DESCRIPTION OF THE DRAWINGS

Other features and advantages will become apparent from the detailed description of various embodiments of the invention, the description containing examples and references to the appended drawings.

FIG. 1 is a schematic cross-sectional view illustrating a first embodiment of a stack subjected to a process according to the invention.

FIG. 2 is a schematic cross-sectional view illustrating a second embodiment of a stack subjected to a process according to the invention.

FIG. 3 is a schematic cross-sectional view illustrating a third embodiment of a stack subjected to a process according to the invention.

FIG. 4 is a schematic cross-sectional view illustrating a fourth embodiment of a stack subjected to a process according to the invention.

The figures are not to scale to simplify comprehension thereof.

DETAILED DESCRIPTION OF EMBODIMENTS

For the sake of simplicity, elements that are identical or that perform the same function have been designated with the same references in the various embodiments.

One subject of the invention is a passivation process comprising the successive steps of:
a) providing a stack 1 comprising, in succession, a substrate 2 based on crystalline silicon, a layer of silicon oxide 3, and at least one layer of transparent conductive oxide; and
b) applying a hydrogen-containing plasma to the stack 1, step b) being executed at a suitable temperature so that hydrogen atoms of the hydrogen-containing plasma diffuse to the interface I between the substrate 2 and the layer of silicon oxide 3.

Stack

The substrate 2 preferably has a thickness strictly smaller than 250 µm. The silicon on which the substrate 2 is based may be single-crystal silicon or polysilicon. The substrate 2 may be doped n-type or p-type. The stack 1 may incorporate, on its front side and/or its back side, a homojunction photovoltaic cell, for example a PERC photovoltaic cell (PERC being the acronym of "Passivated Emitter and Rear Cell").

The layer of silicon oxide 3 of the stack 1 provided in step a) advantageously has a thickness smaller than or equal to 4 nm, and preferably smaller than or equal to 2 nm. Generally, the layer of silicon oxide 3 is sufficiently thin to not significantly affect the electrical conductivity of the stack 1, with respect to movement of charge carriers. Step a) is executed so that the layer of silicon oxide 3 is introduced between the substrate 2 and the one or more layers of transparent conductive oxide 4. The stack 1 is devoid of a layer of amorphous silicon.

The one or more layers of transparent conductive oxide 4 are advantageously formed on the layer of silicon oxide using a deposition technique chosen from atomic layer deposition (ALD), physical vapour deposition (PVD), and plasma-enhanced chemical vapour deposition (PECVD). The one or more layers of transparent conductive oxide 4 advantageously have a total thickness comprised between 10 nm and 200 nm. The transparent conductive oxide is advantageously selected from an indium oxide and a zinc oxide. The indium oxide is preferably chosen from indium-tin oxide, a fluorine-doped indium oxide, a hydrogen-containing indium oxide and a tungsten-doped indium oxide. The zinc oxide is preferably chosen from an aluminium-doped zinc oxide and a boron-doped zinc oxide. The transparent conductive oxide is advantageously selected from a zinc oxide, an aluminium-doped zinc oxide, and a boron-doped zinc oxide.

A single layer of transparent conductive oxide 4 is illustrated in the appended figures, but it is entirely envisageable to provide a stack of a plurality of layers of transparent conductive oxide 4, which layers may for example be made from different transparent conductive oxides.

As illustrated in FIGS. 2 and 4, step a) advantageously comprises a step $a_1$) consisting in forming a layer of alumina 5 on the one or more layers of transparent conductive oxide 4. Step $a_1$) is advantageously executed so that the layer of alumina 5 has a thickness smaller than or equal to 20 nm, and preferably comprised between 2 nm and 10 nm. Step $a_1$) is advantageously executed using a deposition technique chosen from atomic layer deposition (ALD), physical vapour deposition (PVD), and chemical vapour deposition. The chemical vapour deposition may be plasma-enhanced chemical vapour deposition (PECVD).

In the absence of a layer of alumina 5, the one or more layers of transparent conductive oxide 4 advantageously have a total thickness comprised between 10 nm and 80 nm. Such a thickness range allows the best results to be obtained in terms of implied open-circuit voltage (iVoc) when the one or more layers of transparent conductive oxide 4 are deposited by PVD or ALD.

In the presence of a layer of alumina 5, the one or more layers of transparent conductive oxide 4 advantageously have a total thickness comprised between 40 nm and 200 nm. Such a thickness range allows the best results to be obtained in terms of iVoc when the one or more layers of transparent conductive oxide 4 are deposited by ALD. It has been observed that the presence of a layer of alumina 5 has little influence on the iVoc when the one or more layers of transparent conductive oxide 4 are deposited by PVD.

As illustrated in FIGS. 3 and 4, step a) may be executed so that a layer of polysilicon 6 is inserted between the layer of silicon oxide 3 and the one or more layers of transparent conductive oxide 4.

Hydrogen-Containing Plasma

The hydrogen-containing plasma applied in step b) advantageously contains at least one gas selected from $NH_3$ and $H_2$. Step b) may be executed under an atmosphere containing an inert gas selected from Ar and $N_2$.

The temperature at which step b) is executed is advantageously comprised between 340° C. and 600° C., preferably comprised between 400° C. and 550° C., and more preferably comprised between 400° C. and 500° C.

The hydrogen-containing plasma is advantageously applied, in step b), with a power density comprised between $1 \times 10^{-3}$ W·cm$^{-2}$ and $2 \times 10^{-2}$ W·cm$^{-2}$, and preferably comprised between $5 \times 10^{-3}$ W·cm$^{-2}$ and $1 \times 10^{-2}$ W·cm$^{-2}$. The hydrogen-containing plasma is advantageously applied, in step b), with a pressure comprised between 1.5 torr and 2.5 torr (i.e. comprised between 200 Pa and 333 Pa), and preferably comprised between 1.7 torr and 2.2 torr (i.e. comprised between 226 Pa and 293 Pa). Step b) is advantageously executed for a time comprised between 5 minutes and 90 minutes, and preferably comprised between 10 minutes and 30 minutes.

Fabrication of a Photovoltaic Cell

For application to fabrication of photovoltaic cells, the process may comprise a step c) consisting in forming an electrical contact on the stack 1.

Step c) is executed after step b).

By way of example, the electrical contact may be obtained using an electrically conductive screen-printing paste formed on the one or more layers of transparent conductive oxide 4. The screen-printing paste advantageously possesses a baking temperature lower than or equal to 600° C.

Example of an Embodiment

The stack 1 provided in step a) comprised, in succession, a substrate 2 based on single-crystal silicon, a layer of silicon oxide 3, a layer of transparent conductive oxide 4 made of aluminium-doped zinc oxide (AZO), and a layer of alumina 5. The layer of silicon oxide 3 had a thickness of about 4 nm. The layer of transparent conductive oxide (TCO below) had a thickness of 40 nm and was deposited by ALD. The layer of alumina 5 had a thickness of 10 nm. Step b) was executed by applying an $NH_3$ plasma, with a power density of about $9.2 \times 10^{-3}$ W/cm$^2$. The temperature at which step b) was executed was about 500° C. It was possible to observe an implied open-circuit voltage (iVoc) of about 716 mV after step b), indicating an excellent passivation of the interface I between the substrate 2 and the layer of silicon oxide 3. By way of comparison, the implied open-circuit voltage of the stack 1 was lower than 580 mV before step b).

Other Examples of Embodiments

The stack 1 provided in step a) comprised, in succession, a substrate 2 based on single-crystal silicon, a layer of silicon oxide 3, a layer of transparent conductive oxide 4 made of aluminium-doped zinc oxide (AZO), and where appropriate a layer of alumina 5. The layer of transparent conductive oxide (TCO below) had a variable thickness and was deposited by PVD or ALD. Step b) was executed by applying an $NH_3$ plasma, with a power density of about $9.2 \times 10^{-3}$ W/cm$^2$. The temperature at which step b) was executed was comprised between 450° C. and 500° C. The results of the experiments in terms of implied open-circuit voltage (iVoc) are collated in the table below.

| Total thickness (nm) of TCO(s) | Deposition technique for the one or more TCOs | Thickness (nm) of the layer of alumina | iVoc (mV) |
| --- | --- | --- | --- |
| 20 | PVD | 0 | 632 |
| 40 | PVD | 0 | 595 |
| 80 | PVD | 0 | 570 |
| 20 | PVD | 10 | 575 |
| 40 | PVD | 10 | 585 |
| 80 | PVD | 10 | 602 |
| 20 | ALD | 10 | 670 |
| 40 | ALD | 10 | 630 |
| 120 | ALD | 10 | 705 |

An increase in the value of iVoc (of between 14 mV and 32 mV) with respect to a stack 1 simply subjected to a thermal anneal at between 450° C. and 500° C., i.e. in the absence of a treatment in a hydrogen-containing plasma in step b), was observed. Thus, such a process according to the invention allowed the passivation of the surface of the substrate to be improved, despite the presence of the one or more TCOs 4, and by virtue of step b).

In addition, it may be seen that the presence of the layer of alumina 5 had little influence when the one or more TCOs 4 are deposited by PVD. In contrast, the layer of alumina 5 allowed the passivation properties to be improved when the one or more TCOs 4 were deposited by ALD.

In another example of an embodiment, the stack 1 provided in step a) comprised, in succession, a substrate 2 based on single-crystal silicon, a layer of silicon oxide 3, and a monolayer of transparent conductive oxide 4 made of aluminium-doped zinc oxide (AZO). The monolayer made of AZO was deposited by PVD and possessed a thickness of 40 nm. Step b) was executed by applying an $NH_3$ plasma, with a power density of about $9.2 \times 10^{-3}$ $W/cm^2$. The temperature at which step b) was executed was about 500° C. It was possible to observe an implied open-circuit voltage of about 597 mV after step b). The same experiment was carried out with a bilayer of transparent conductive oxide 4 made of AZO, comprising a first layer of AZO of 20 nm deposited by ALD and a second layer of AZO of 40 nm deposited by PVD. It was possible to observe an implied open-circuit voltage of about 630 mV after step b). It may be concluded that the addition of the first layer of AZO of 20 nm deposited by ALD allowed the implied open-circuit voltage to be increased, and thus improved the passivation of the interface between the substrate and the layer of silicon oxide.

The invention is not limited to the described embodiments. Those skilled in the art will be able to consider technically operable combinations thereof, and to substitute equivalents therefor.

The invention claimed is:

1. A passivation process comprising the successive steps of:
   a) providing a stack comprising, in succession, a substrate based on crystalline silicon, a layer of silicon oxide, and at least one layer of transparent conductive oxide; and
   b) applying a hydrogen-containing plasma to the stack, step b) being executed at a suitable temperature for the hydrogen-containing plasma so that hydrogen atoms of the hydrogen-containing plasma diffuse from the hydrogen-containing plasma to the interface between the substrate and the layer of silicon oxide.

2. The process according to claim 1, wherein the hydrogen-containing plasma applied in step b) contains at least one gas selected from $NH_3$ and $H_2$.

3. The process according to claim 1, wherein a temperature at which step b) is executed is comprised between 340° C. and 600° C.

4. The process according to claim 1, wherein the hydrogen-containing plasma is applied in step b) with a power density comprised between $1 \times 10^{-3}$ $W \cdot cm^{-2}$ and $2 \times 10^{-2}$ $W \cdot cm^{-2}$.

5. The process according to claim 1, wherein the hydrogen-containing plasma is applied in step b) with a pressure comprised between 1.5 torr and 2.5 torr.

6. The process according to claim 1, wherein step b) is executed under an atmosphere containing an inert gas selected from Ar and $N_2$.

7. The process according to claim 1, wherein step b) is executed for a time comprised between 5 minutes and 90 minutes.

8. The process according to claim 1, wherein the layer of silicon oxide of the stack provided in step a) has a thickness smaller than or equal to 4 nm.

9. The process according to claim 1, wherein the at least one layer of transparent conductive oxide has a total thickness comprised between 10 nm and 200 nm.

10. The process according to claim 1, wherein the transparent conductive oxide is selected from an indium oxide and a zinc oxide.

11. The process according to claim 10, wherein the transparent conductive oxide is selected from a zinc oxide, an aluminum-doped zinc oxide and a boron-doped zinc oxide.

12. The process according to claim 1, wherein step a) comprises a step $a_1$) consisting in forming a layer of alumina on the one or more layers of transparent conductive oxide.

13. The process according to claim 12, wherein step $a_1$) is executed so that the layer of alumina has a thickness smaller than or equal to 20 nm.

14. The process according to claim 12, wherein step $a_1$) is executed using a deposition technique chosen from ALD, physical vapor deposition (PVD) and chemical vapor deposition (CVD).

15. The process according to claim 1, wherein step a) is executed so that a layer of polysilicon is inserted between the layer of silicon oxide and the one or more layers of transparent conductive oxide.

16. The process according to claim 1, wherein a temperature at which step b) is executed is comprised between 400° C. and 550° C.

17. The process according to claim 1, wherein the hydrogen-containing plasma is applied in step b) with a power density comprised between $5 \times 10^{-3}$ $W \cdot cm^{-2}$ and $1 \times 10^{-2}$ $W \cdot cm^{-2}$.

18. The process according to claim 1, wherein the hydrogen-containing plasma is applied in step b) with a pressure comprised between 1.7 torr and 2.2 torr.

19. The process according to claim 1, wherein step b) is executed for a time comprised between 10 minutes and 30 minutes.

20. The process according to claim 10, wherein
   the indium oxide is chosen from indium-tin oxide, a fluorine-doped indium oxide, a hydrogen-containing indium oxide and a tungsten-doped indium oxide, and
   the zinc oxide is chosen from an aluminum-doped zinc oxide and a boron-doped zinc oxide.

21. The process according to claim 1, wherein:
   providing the stack comprises providing the at least one layer of transparent conductive oxide having a first layer formed by atomic layer deposition (ALD) on the layer of silicon oxide and a second layer formed by physical vapor deposition (PVD) on the first layer.

22. The process according to claim 21, wherein each of the first and second layers comprises zinc oxide.

23. The process according to claim 21, wherein each of the first and second layers comprises aluminum-doped zinc oxide.

24. The process according to claim 21, comprising forming the first layer directly on the silicon oxide layer.

25. The process according to claim 1, comprising thermally diffusing the hydrogen atoms of the hydrogen-containing plasma to the interface between the substrate and the layer of silicon oxide.

* * * * *